(12) United States Patent
Ootsuka

(10) Patent No.: US 10,490,586 B2
(45) Date of Patent: Nov. 26, 2019

(54) SOLID-STATE IMAGING DEVICE WITH LIGHT SHIELDING FILMS, METHOD OF MANUFACTURING THE SAME, AND ELECTRONIC APPARATUS

(71) Applicant: SONY SEMICONDUCTOR SOLUTIONS CORPORATION, Kanagawa (JP)

(72) Inventor: Yoichi Ootsuka, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/512,208

(22) PCT Filed: Sep. 18, 2015

(86) PCT No.: PCT/JP2015/076630
§ 371 (c)(1),
(2) Date: Mar. 17, 2017

(87) PCT Pub. No.: WO2016/052249
PCT Pub. Date: Apr. 7, 2016

(65) Prior Publication Data
US 2017/0287962 A1    Oct. 5, 2017

(30) Foreign Application Priority Data
Oct. 3, 2014   (JP) .................. 2014-204532

(51) Int. Cl.
*H01L 27/146*   (2006.01)
*H04N 5/369*   (2011.01)

(52) U.S. Cl.
CPC .... *H01L 27/14623* (2013.01); *H01L 27/1463* (2013.01); *H01L 27/1464* (2013.01);
(Continued)

(58) Field of Classification Search
CPC .................... H01L 27/14623; H01L 27/14621
See application file for complete search history.

(56) References Cited

U.S. PATENT DOCUMENTS

| 8,981,512 B1* | 3/2015 | Chen ................. H01L 27/14621 257/432 |
| 2008/0191209 A1* | 8/2008 | Moon ............... H01L 27/14623 257/59 |

(Continued)

FOREIGN PATENT DOCUMENTS

| JP | 61-085860 A | 5/1986 |
| JP | 01-287961 A | 11/1989 |

(Continued)

*Primary Examiner* — Lex H Malsawma
*Assistant Examiner* — Laura M Dykes
(74) *Attorney, Agent, or Firm* — Chip Law Group

(57) ABSTRACT

Provided is a solid-state imaging device that includes: a semiconductor substrate having photodiodes formed for respective pixels, the photodiodes performing photoelectric conversion; color filters that pass light in the colors corresponding to the respective pixels, the color filters being stacked on the light incident surface side of the semiconductor substrate; and a light shielding film provided between the color filters of the respective pixels, the light shielding film being formed by stacking a first light shielding film and a second light shielding film, the first light shielding film and the second light shielding film being formed with two different materials from each other. The first light shielding film is formed with a metal having a light shielding effect, and the second light shielding film is formed with a resin having photosensitivity. The present technology can be applied to back-illuminated CMOS image sensors, for example.

8 Claims, 11 Drawing Sheets

(52) U.S. Cl.
CPC .. *H01L 27/14621* (2013.01); *H01L 27/14627* (2013.01); *H04N 5/3696* (2013.01)

(56) References Cited

U.S. PATENT DOCUMENTS

| | | | | |
|---|---|---|---|---|
| 2009/0230494 | A1* | 9/2009 | Takizawa | H01L 27/14623 257/435 |
| 2010/0214453 | A1* | 8/2010 | Murata | G02B 3/0056 348/266 |
| 2011/0108938 | A1* | 5/2011 | Nozaki | H01L 27/14621 257/432 |
| 2012/0235266 | A1* | 9/2012 | Ootsuka | H01L 27/14623 257/432 |
| 2012/0262654 | A1* | 10/2012 | Moriwaki | G02F 1/133512 349/106 |
| 2014/0085516 | A1* | 3/2014 | Maeda | H04N 9/045 348/273 |
| 2015/0349030 | A1* | 12/2015 | Ono | H01L 51/5284 257/40 |

FOREIGN PATENT DOCUMENTS

| | | |
|---|---|---|
| JP | 2005-294647 A | 10/2005 |
| JP | 2013-229446 A | 11/2013 |
| JP | 2014-110619 A | 6/2014 |

* cited by examiner d : MICROLENS ARRAY PITCH
Θ : DIFFRACTION ANGLE (deg.)
λ : WAVELENGTH $$d \sin\Theta = m\lambda$$

| UNIT PIXEL SIZE | DIFFRACTED LIGHT ORDER (±ORDER) | |
|---|---|---|
| | HORIZONTAL/VERTICAL DIRECTION | DIAGONAL DIRECTION |
| 1.75 μm□ | 4 | 6 |
| 1.979 μm□ | 4 | 6 |
| 1.980 μm□ | 4 | 7 |
| 1.999 μm□ | 4 | 7 |
| 2.000 μm□ | 5 | 7 |

SOLID-STATE IMAGING DEVICE WITH LIGHT SHIELDING FILMS, METHOD OF MANUFACTURING THE SAME, AND ELECTRONIC APPARATUS

CROSS REFERENCE TO RELATED APPLICATIONS

This application is a U.S. National Phase of International Patent Application No. PCT/JP2015/076630 filed on Sep. 18, 2015, which claims priority benefit of Japanese Patent Application No. JP 2014-204532 filed in the Japan Patent Office on Oct. 3, 2014. Each of the above-referenced applications is hereby incorporated herein by reference in its entirety.

TECHNICAL FIELD

The present disclosure relates to a solid-state imaging device, a method of manufacturing the solid-state imaging device, and an electronic apparatus, and more particularly, to a solid-state imaging device that can reduce image quality degradation and achieve a higher image quality, a method of manufacturing the solid-state imaging device, and an electronic apparatus.

BACKGROUND ART

In a conventional electronic apparatus having an imaging function, such as a digital still camera or a digital video camera, a solid-state imaging device like a charge coupled device (CCD) or a complementary metal oxide semiconductor (CMOS) image sensor is used. A solid-state imaging device has pixels each including a combination of a photodiode that performs photoelectric conversion and transistors, and an image is formed in accordance with pixel signals that are output from the pixels arranged in a two-dimensional fashion.

In recent years, back-illuminated solid-state imaging devices are often used. In a back-illuminated solid-state imaging device, light is emitted onto photodiodes from the back surface side, which is the opposite side from the front surface side on which transistors and wiring layers are stacked on a semiconductor substrate. Back-illuminated solid-state imaging devices are used in compact digital still cameras, cameras for mobile terminals, and the like, and can increase the sensitivity of fine pixels and improve shading characteristics.

For example, a back-illuminated solid-state imaging device can have larger photodiode areas than those in a front-illuminated solid-state imaging device, and characteristically has no wiring layers on the light incident side. Because of these features, a back-illuminated solid-state imaging device can efficiently take incident light into the photodiodes, and achieve excellent sensitivity characteristics. However, a back-illuminated solid-state imaging device takes more reflected light into the photodiodes from the sealing glass surface, an infrared cut filter, the optical system of the camera set, and the like. As a result, flare, ghosts, and color mixing easily occur, and the image quality is degraded. Particularly, in a large-sized solid-state imaging device, the pixel size is large, and the light receiving region is wide. Therefore, the photodiodes take in a large amount of unnecessary light, making the image quality degradation more conspicuous.

To counter this, techniques for preventing unnecessary light from entering photodiodes by providing a light shielding portion between pixels have been developed, as disclosed in Patent Documents 1 and 2, for example.

CITATION LIST

Patent Documents

Patent Document 1: Japanese Patent Application Laid-Open No. 2005-294647.
Patent Document 2: Japanese Patent Application Laid-Open No. 2013-229446.

SUMMARY OF THE INVENTION

Problems to be Solved by the Invention

As described above, in a conventional solid-state imaging device, reflected light enters the photodiodes, and degrades the image quality. In view of this, there is a demand for prevention of generation of reflected light, to decrease image quality degradation and achieve a higher image quality.

The present disclosure is made in view of those circumstances, and aims to reduce image quality degradation and achieve a higher image quality.

Solutions to Problems

A solid-state imaging device according to one aspect of the present disclosure includes: a semiconductor substrate having photodiodes formed for respective pixels, the photodiodes performing photoelectric conversion; color filters configured to pass light in the colors corresponding to the respective pixels, the color filters being stacked on the light incident surface side of the semiconductor substrate; and a light shielding film provided between the color filters of the respective pixels, the light shielding film being formed by stacking a first light shielding film and a second light shielding film, the first light shielding film and the second light shielding film being formed with two different materials from each other.

A manufacturing method according to one aspect of the present disclosure includes the steps of: forming photodiodes in a semiconductor substrate for respective pixels, the photodiodes performing photoelectric conversion; stacking color filters on the light incident surface side of the semiconductor substrate, the color filters passing light in the colors corresponding to the respective pixels; and providing a light shielding film between the color filters of the respective pixels, the light shielding film being formed by stacking a first light shielding film and a second light shielding film, the first light shielding film and the second light shielding film being formed with two different materials from each other.

An electronic apparatus according to one aspect of the present disclosure includes a solid-state imaging device that includes: a semiconductor substrate having photodiodes formed for respective pixels, the photodiodes performing photoelectric conversion; color filters configured to pass light in the colors corresponding to the respective pixels, the color filters being stacked on the light incident surface side of the semiconductor substrate; and a light shielding film provided between the color filters of the respective pixels, the light shielding film being formed by stacking a first light shielding film and a second light shielding film, the first light shielding film and the second light shielding film being formed with two different materials from each other.

In one aspect of the present disclosure, color filters that pass light in the colors corresponding to the respective pixels are stacked on the light incident surface side of the semiconductor substrate having photodiodes formed therein for the respective pixels. The photodiodes perform photoelectric conversion. A light shielding film formed by stacking a first light shielding film and a second light shielding film is provided between the color filters of the respective pixels. The first light shielding film and the second light shielding film are formed with two different materials from each other.

Effects of the Invention

According to one aspect of the present disclosure, image quality degradation can be reduced, and a higher image quality can be achieved.

MODES FOR CARRYING OUT THE INVENTION

The following is a detailed description of specific embodiments to which the present technology is applied, with reference to the drawings.

Figure 1:
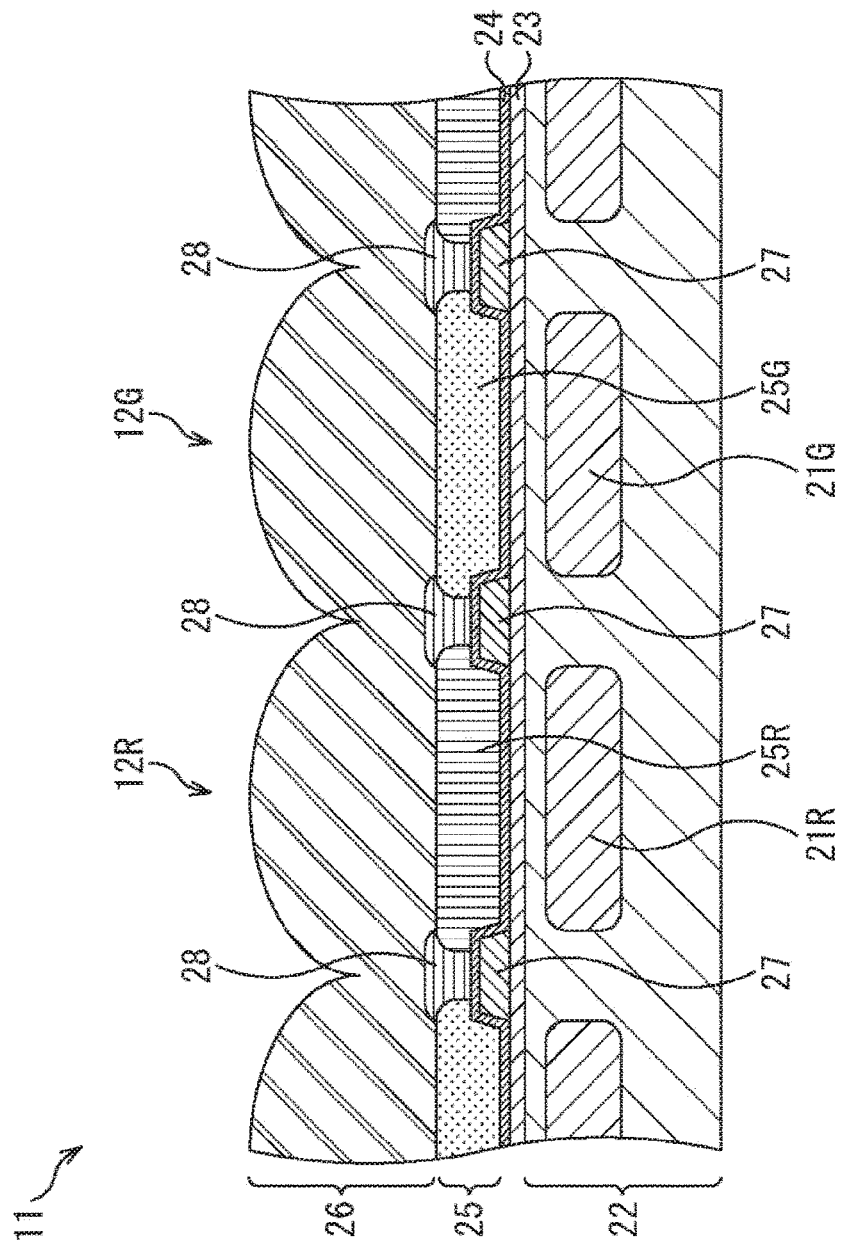
FIG. 1 is a diagram showing an example configuration of a first embodiment of a solid-state imaging device to which the present technology is applied.

FIG. 1 is a diagram showing an example configuration of a first embodiment of a solid-state imaging device to which the present technology is applied.

FIG. 1 shows a cross-section of the configuration near a region in which a red pixel 12R and a green pixel 12G are disposed among the pixels provided on the sensor surface of the solid-state imaging device 11. It should be noted that the red pixels 12R and the green pixel 12G, and the later described blue pixels 12B will be hereinafter referred simply as the pixels 12 where there is no need to distinguish these pixels from one another.

As shown in FIG. 1, the solid-state imaging device 11 is formed by stacking an insulating film 23, a non-planarized adhesive film 24, color filters 25, and microlenses 26, in this order from the bottom, on a semiconductor substrate 22 in which the photodiode 21R of the red pixel 12R and the photodiode 21G of the green pixel 12G are formed. Also, in the solid-state imaging device 11, a first light shielding film 27 and a second light shielding film 28 are formed between adjacent pixels 12.

The semiconductor substrate 22 is a silicon wafer obtained by cutting a single crystal of high-purity silicon into thin slices, for example. In the semiconductor substrate 22, photodiodes 21 that convert incident light into electrical charges through photoelectric conversion are formed for the respective pixels 12.

The insulating film 23 insulates the surface on the side on which light enters the semiconductor substrate 22 (this surface will be hereinafter referred to as the light incident surface where appropriate). For example, the insulating film 23 is formed with a stack structure in which a hafnium oxide film is stacked on a silicon oxide film, and also has a function to prevent reflection from the light incident surface of the semiconductor substrate 22.

The non-planarized adhesive film 24 is formed on the insulating film 23 and the first light shielding film 27, and increase the adhesion between the color filters 25 and the second light shielding film 28. The non-planarized adhesive film 24 is formed with an acrylic resin, a phenol resin, a siloxane resin, an epoxy resin, or a copolymer resin of these resins, for example.

The color filters 25 pass the light in predetermined colors corresponding to the pixels 12, and the color filters 25 of the colors corresponding to the pixels 12 of the respective colors are provided for the respective pixels 12. That is, as shown in the drawing, a red color filter 25R is provided for a red pixel 12R, and a green color filter 25G is provided for a green pixel 12G. Each color filter 25 is formed with a resin having an organic pigment internally added thereto, and is designed to have a thickness of approximately 400 to 1000 nm, for example.

The microlenses 26 are designed to gather light for the respective pixels 12, and are formed with a polystyrene resin, an acrylic resin, or a copolymer resin of these resins, for example.

The first light shielding film 27 is stacked on the insulating film 23 so as to be located between the adjacent pixels 12, and shields the pixels 12 from light from one another. The first light shielding film 27 is formed with a metal having a light shielding effect, such as tungsten, aluminum, or copper, and is designed to have a thickness of approximately 200 to 300 nm.

The second light shielding film 28 is stacked on the first light shielding film 27 via the non-planarized adhesive film 24 so as to be located between the adjacent pixels 12, and shields the pixels 12 from light from one another. The second light shielding film 28 is formed with a resin having photosensitivity (light absorption properties), for example. Such a resin has a carbon black pigment or a titanium black pigment internally added thereto.

As described above, the first light shielding film 27 and the second light shielding film 28 are formed with different materials from each other. The first light shielding film 27 is stacked closer to the semiconductor substrate 22 than the second light shielding film 28 is, or the second light shielding film 28 is stacked on the light incident side. Also, the first light shielding film 27 and the second light shielding film 28 are designed to have substantially the same thickness as the color filters 25. That is, the first light shielding film 27 and the second light shielding film 28 are designed to be located between the color filters 25 provided for the respective pixels 12. Accordingly, the solid-state imaging device 11 has a smaller height than the above described configuration disclosed in Patent Document 1, for example.

The solid-state imaging device 11 has the above described configuration. As the two-layer structure formed with the first light shielding film 27 and the second light shielding film 28 is employed, the pixels 12 can be shielded from light from one another without fail, and light reflection between the pixels 12 can be prevented. That is, the configuration including the second light shielding film 28 formed with a resin having photosensitivity can reduce light reflection more effectively than a configuration including only the first light shielding film 27 formed with a metal having a light shielding effect, for example.

As described above, the solid-state imaging device 11 reduces light reflection. As a result, reflected light can be prevented from reentering the photodiodes 21. Thus, image quality degradation due to flare and ghosts can be reduced, and a higher image quality can be achieved.

Figure 2:
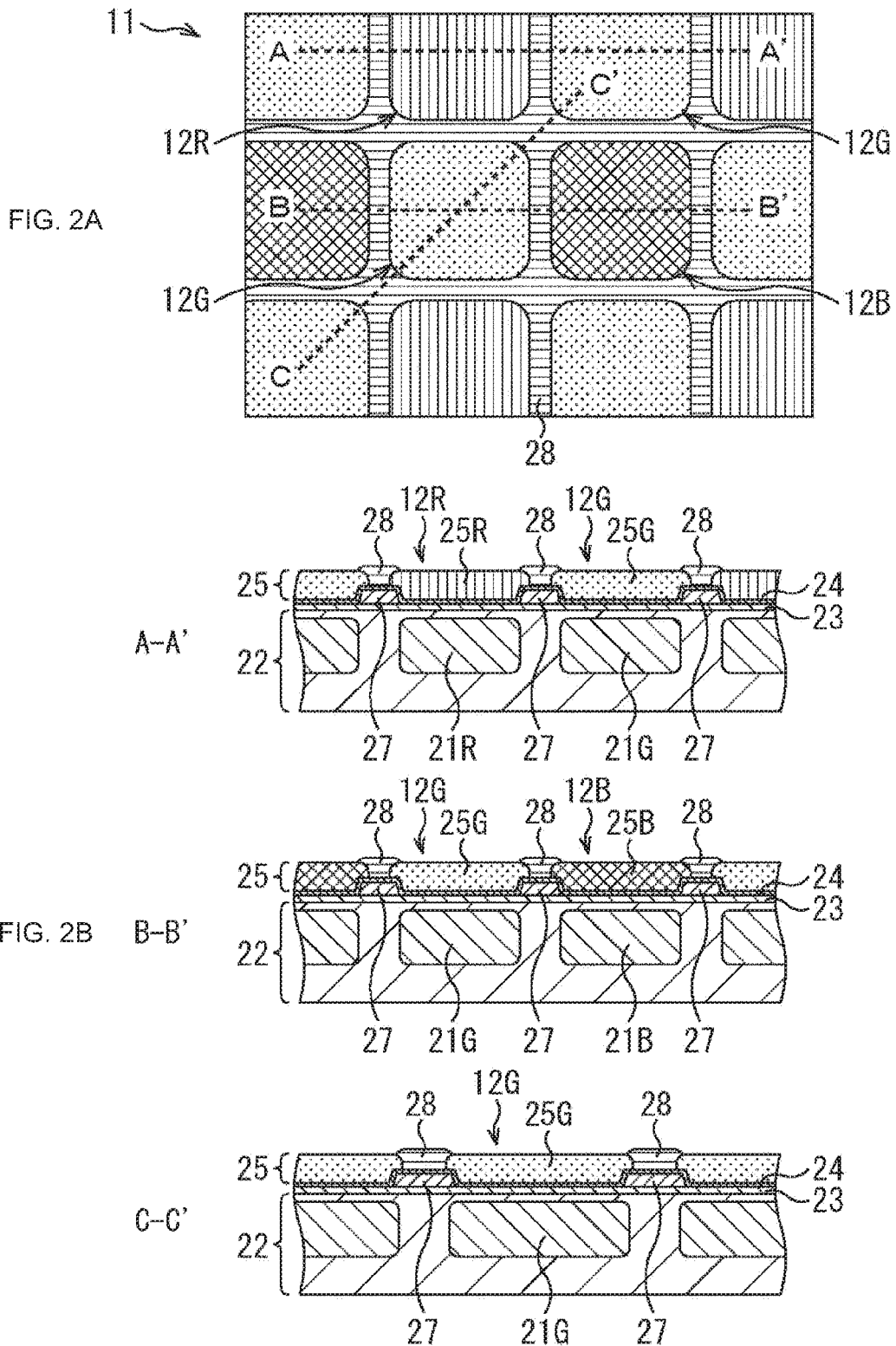
FIGS. 2A and 2B are diagrams showing a plan view and cross-sectional views of the configuration of the solid-state imaging device.

Referring now to FIGS. 2A and 2B, the configuration of the solid-state imaging device 11 is described in greater detail.

FIG. 2A shows a plan view of the configuration of the solid-state imaging device 11. FIG. 2B shows cross-sections taken along the lines A-A', B-B', and C-C' defined in FIG. 2A.

As shown in FIG. 2A, in the solid-state imaging device 11, red pixels 12R, green pixels 12G, and blue pixels 12B are arranged in a so-called Bayer array.

FIG. 2B shows the A-A' cross-section taken along the row in which red pixels 12R and green pixels 12G are arranged, the B-B' cross-section taken along the row in which green pixels 12G and blue pixels 12B are arranged, and the C-C' cross-section taken along the diagonal lines of green pixels 12G.

As described above, in the solid-state imaging device 11, the two-layer structure formed with the first light shielding film 27 and the second light shielding film 28 is formed between the pixels 12, so that the red pixels 12R, the green pixels 12G, and the blue pixels 12B become independent of one another. Because of this, the solid-state imaging device 11 can increase the light shielding effect between the pixels 12, and prevent unnecessary light from entering the pixels 12. Thus, the solid-state imaging device 11 can form an image with a higher quality.

Figure 3:
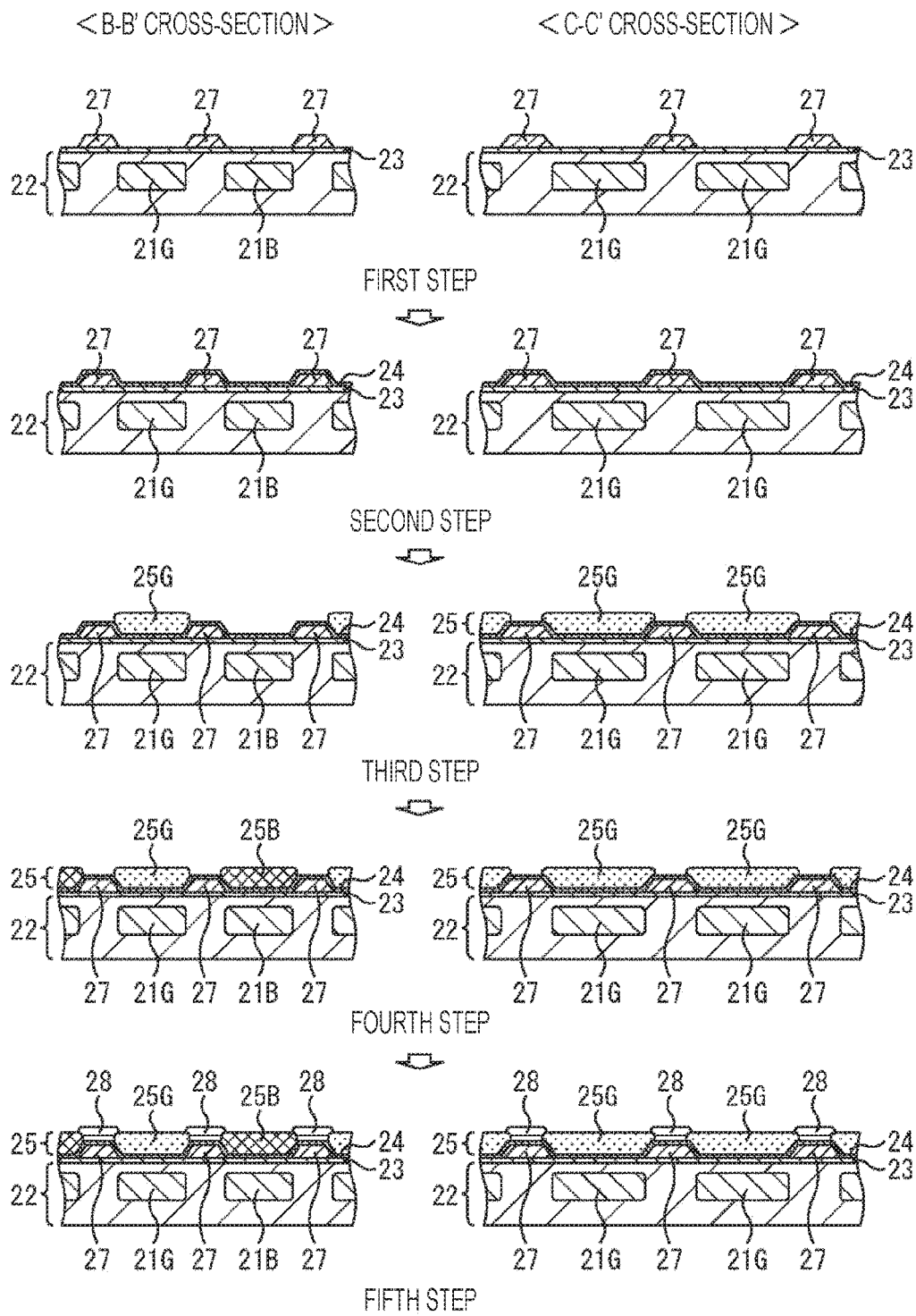
FIG. 3 is a diagram for explaining a method of manufacturing the solid-state imaging device.
Figure 4:
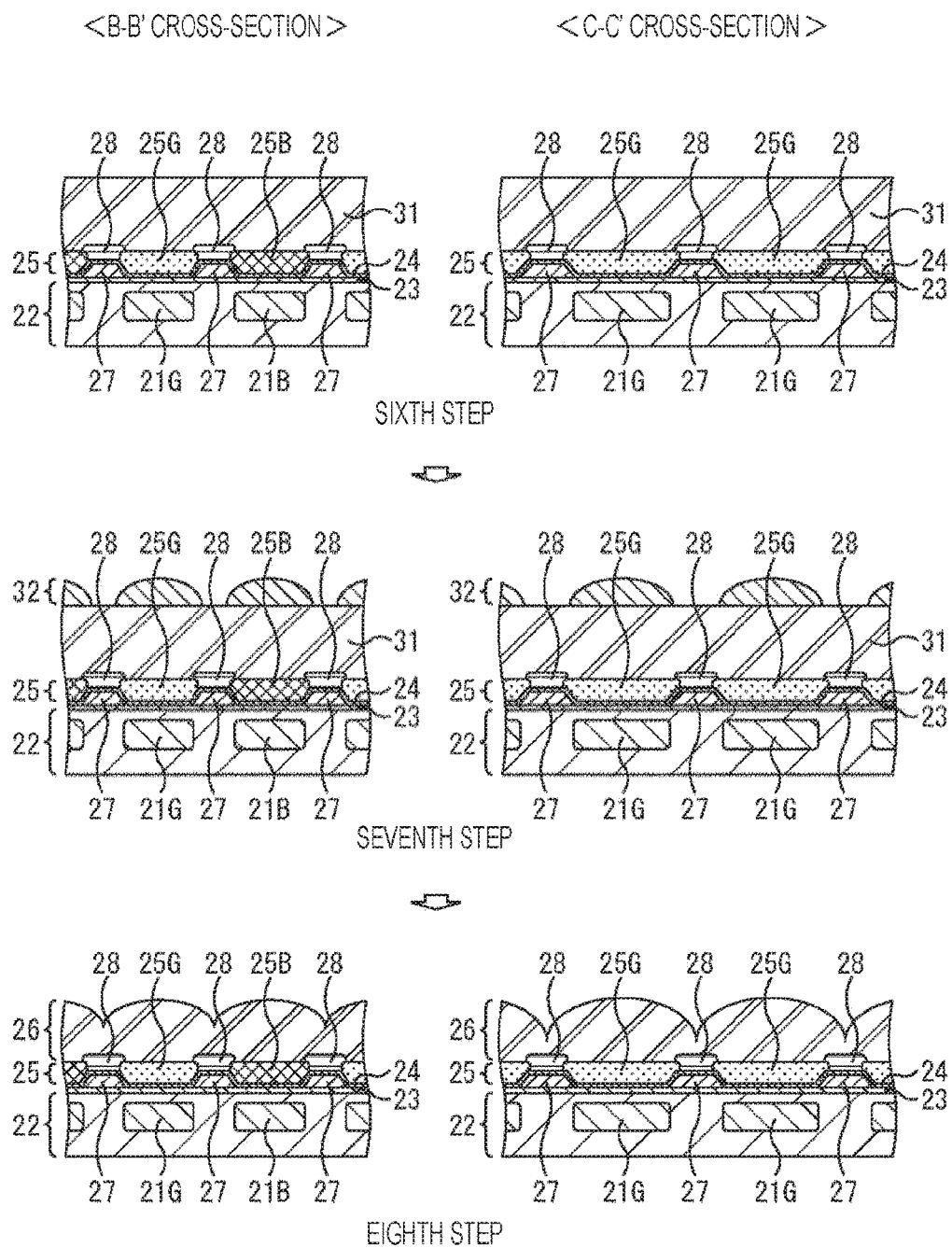
FIG. 4 is a diagram for explaining the method of manufacturing the solid-state imaging device.

Referring now to FIGS. 3 and 4, a method of manufacturing the solid-state imaging device 11 is described. In FIGS. 3 and 4, B-B' cross-sections (FIG. 2B) are shown on the left side, and C-C' cross-sections (FIG. 2B) are shown on the right side.

As shown in FIG. 3, in a first step, the insulating film 23 is formed on the light incident surface of the semiconductor substrate 22 having the photodiodes 21 formed therein, and the first light shielding film 27 is formed on the insulating film 23 so as to be located between the photodiodes 21. For example, resists are formed to cover the areas where the color filters 25 are to be provided, and a metal having a light shielding effect is deposited on the portions where the resists are not formed. After that, the resist is removed. In this manner, the first light shielding film 27 is formed.

In a second step, the non-planarized adhesive film 24 is formed in conformity with the uneven shapes of the insulating film 23 and the first light shielding film 27, to cover the insulating film 23 and the first light shielding film 27.

In a third step, green color filters 25G are stacked on the portions corresponding to the green pixels 12G. In a fourth step, blue color filters 25B are stacked on the portions corresponding to the blue pixels 12B. It should be noted that, although not shown in the drawing, red color filters 25R are stacked on the portions corresponding to the red pixels 12R likewise.

In a fifth step, the second light shielding film 28 is formed and stacked on the first light shielding film 27 via the non-planarized adhesive film 24, so as to be located between the color filters 25 of the respective colors. For example, resists are formed to cover the color filters 25, and a resin with photosensitivity is buried in the portions where the resists are not formed. After that, the resist is removed. In this manner, the second light shielding film 28 is formed.

Next, as shown in FIG. 4, a microlens matrix 31 is formed and stacked on the color filters 25 and the second light shielding film 28, in a sixth step.

In a seventh step, a photosensitive resin 32 for shaping the microlenses 26 is formed on the microlens matrix 31 at each portion where a pixel 12 is to be formed.

In an eighth process, transfer etching is performed on the microlens matrix 31, with the mask being the photosensitive resin 32 formed in the seventh step. As a result, the microlenses 26 having a convex shape are formed for the respective pixels 12.

By the manufacturing method including the steps described above, it is possible to manufacture the solid-state imaging device 11 that includes the two-layer structure formed with the first light shielding film 27 and the second light shielding film 28 to shield the pixels 12 from light from one another. Also, the first light shielding film 27 and the second light shielding film 28 of the two-layer structure can be formed by using a lithography technique, for example, and can be manufactured at lower costs than those with a manufacturing method using etching or the like. Furthermore, as the two-layer structure is formed with the first light shielding film 27 and the second light shielding film 28, unevenness in application of the color filters 25 can be reduced, for example.

Figure 5:
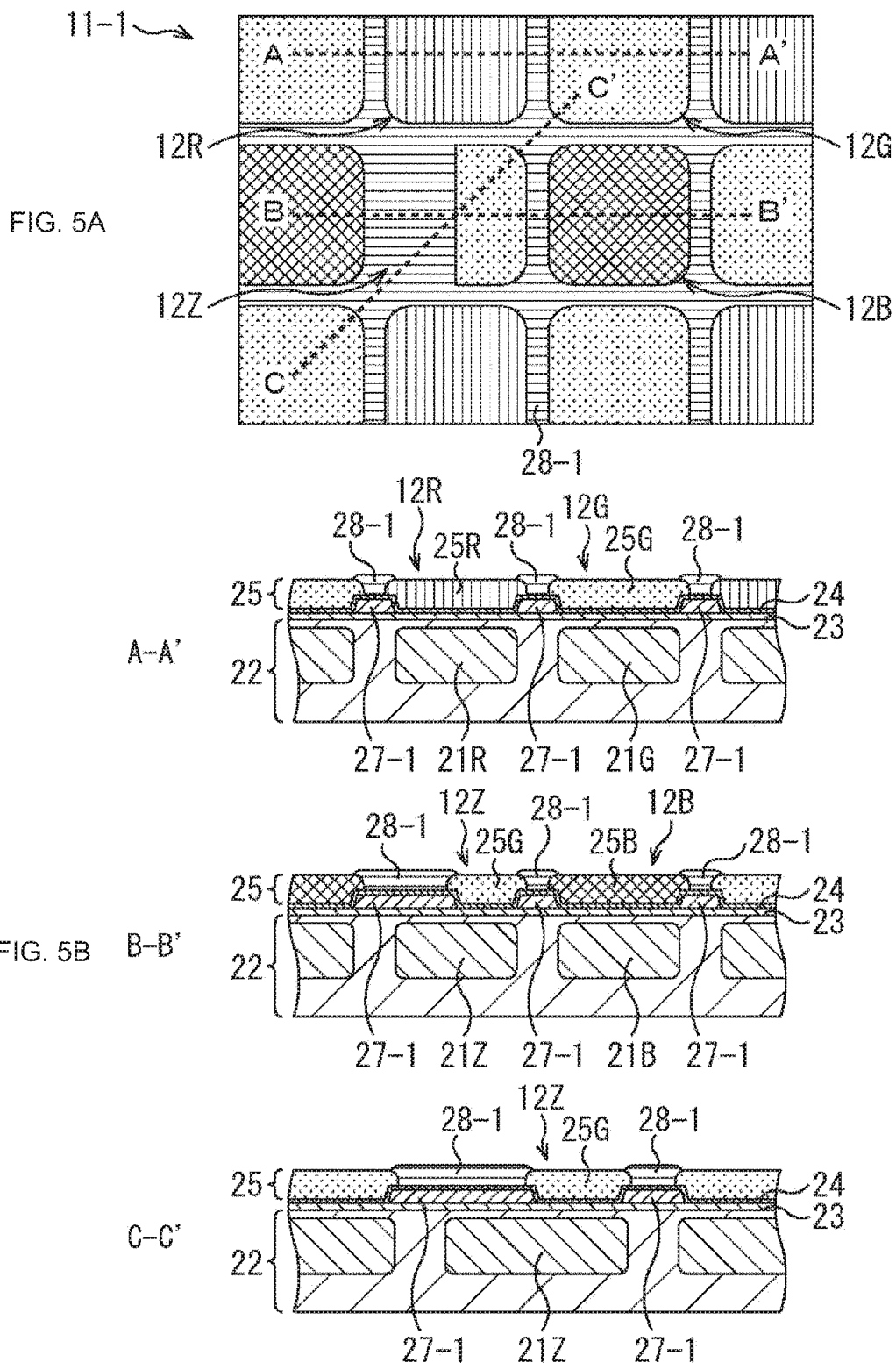
FIGS. 5A and 5B are diagrams showing an example configuration of a second embodiment of a solid-state imaging device.

FIGS. 5A and 5B are diagrams showing an example configuration of a second embodiment of a solid-state imaging device. Like FIG. 2A, FIG. 5A shows a plan view of the configuration of a solid-state imaging device 11-1. Like FIG. 2B, FIG. 5B shows cross-sections taken along the lines A-A', B-B', and C-C' defined in FIG. 5A.

The solid-state imaging device 11-1 shown in FIGS. 5A and 5B are designed to include AF pixels 12Z to be used in an imaging area phase difference AF for controlling autofocusing (AF) in accordance with a phase difference in the imaging surface of the solid-state imaging device 11-1. For the imaging area phase difference AF, an AF pixel 12Z, a half of which is shielded from light for pupil splitting, is used in combination with an AF pixel 12Z, the other half of which is shielded from light. FIGS. 5A and 5B shows one of these AF pixels 28F.

As shown in FIGS. 5A and 5B, in the solid-state imaging device 11-1, a first light shielding film 27-1 and a second light shielding film 28-1 are designed to shield adjacent pixels 12 from light from one another, and also shield substantially a half of each AF pixel 12Z from light. That is, in each AF pixel 12Z, the first light shielding film 27-1 and the second light shielding film 28-1 extend toward the center of the AF pixel 12Z, and cover substantially a half of the AF pixel 12Z.

As described above, in the solid-state imaging device 11-1, light shielding to achieve pupil splitting at the AF pixels 12Z can be performed with the first light shielding film 27-1 and the second light shielding film 28-1 formed in the same layer as the color filters 25. Accordingly, as the solid-state imaging device 11-1 can perform pupil splitting near the photodiodes 21 in this manner, more preferable AF separation characteristics can be achieved.

Also, in a conventional solid-state imaging device, reflected light at the light shielding portion of an AF pixel may turn into stray light, and enter the photodiode of another pixel (a pixel performing imaging), resulting in a poorer image quality, for example. In the solid-state imaging device 11-1, on the other hand, reflection at the light shielding portion of an AF pixel 12Z can be prevented, and accordingly, the amount of reflected light can be made smaller than that in a conventional solid-state imaging device. Thus, a decrease in image quality can be avoided.

Further, as the solid-state imaging device 11-1 is applied to a back-illuminated solid-state imaging device having a structure in which a wiring layer is stacked on the surface on the opposite side from the light receiving surface, the AF performance of the AF pixels 12Z can be improved compared with a front-illuminated solid-state imaging device.

Figure 6:
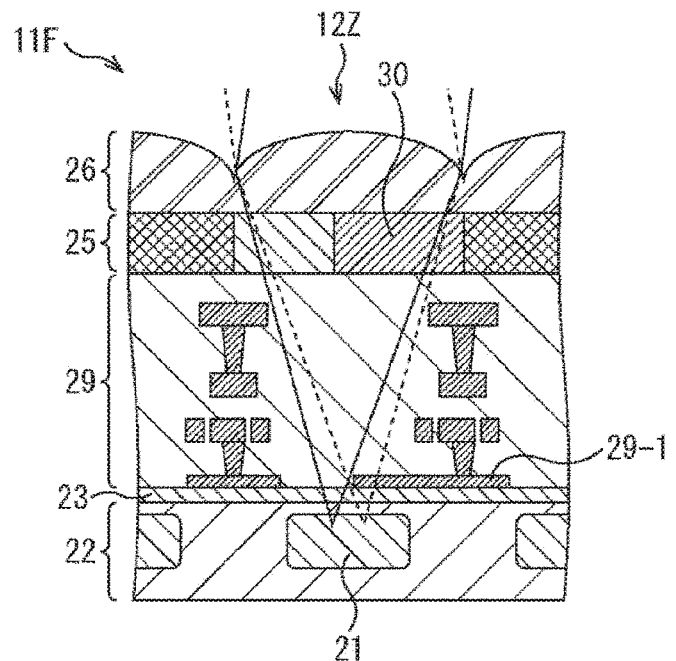
FIG. 6 is a diagram for explaining a front-illuminated solid-state imaging device.

Referring now to FIG. 6, a front-illuminated solid-state imaging device 11F is described.

As shown in FIG. 6, in the front-illuminated solid-state imaging device 11F, the surface on the side on which a multiple wiring layer 29 is stacked on a semiconductor substrate 22 is the light receiving surface, and the multiple wiring layer 29 is provided between the semiconductor substrate 22 and color filters 25. In such a configuration having the multiple wiring layer 29 provided under the color filters 25, accurate pupil splitting is not performed at AF pixels 12Z with a light shielding film 30 provided in the same layer as the color filters 25, and AF separation characteristics are greatly degraded. That is, to improve AF separation characteristics, light shielding for pupil splitting is preferably performed at a first wiring layer 29-1 that is the closest to the photodiodes 21, for example. Therefore, in addition to the light shielding film 30, a light shielding film needs to be formed on the first wiring layer 29-1.

Unlike such a front-illuminated solid-state imaging device 11F, the solid-state imaging device 11-1 shown in FIGS. 5A and 5B has the first light shielding film 27-1 and the second light shielding film 28-1 that are provided in the same layer as the color filters 25 and are located close to the photodiodes 21. Thus, accurate pupil splitting can be performed. That is, unlike the front-illuminated solid-state imaging device 11F, the solid-state imaging device 11-1 does not need to have a light shielding film formed on the first wiring layer 29-1 in addition to the light shielding film 30, but can have more preferable AF pixels 12Z.

It should be noted that, in the solid-state imaging device 11-1 shown in FIGS. 5A and 5B, green color filters 25G are formed in the opening portions of the AF pixels 12Z (the portions not shielded from light by the first light shielding film 27-1 and the second light shielding film 28-1). Alternatively, yellow, cyan, or gray color filters, or transparent filters may be formed in the opening portions of the AF pixels 12Z.

Figure 7:
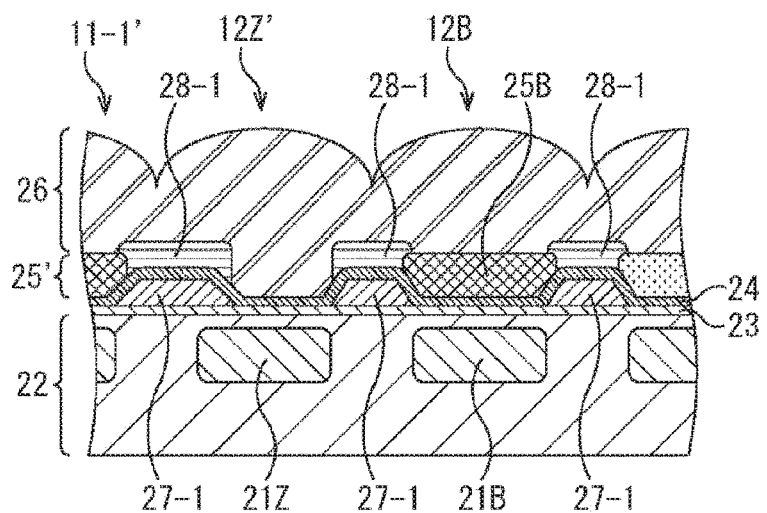
FIG. 7 is a diagram showing a modification of the solid-state imaging device.

Referring now to FIG. 7, a modification of the solid-state imaging device 11-1 is described.

FIG. 7 shows a cross-section of an example configuration of a solid-state imaging device 11-1'. This cross-section is equivalent to the B-B' cross-section shown in FIGS. 5A and 5B. As shown in the drawing, the solid-state imaging device 11-1' has the same configuration as the solid-state imaging device 11-1 shown in FIGS. 5A and 5B, except that the same transparent material as the microlenses 26 is buried in the opening portions of AF pixels 12Z'.

For example, in the third step of the manufacturing method described with reference to FIG. 3, the green color filters 25G are not formed at the portions corresponding to the AF pixels 12Z'. In the sixth step, the opening portions are filled with the microlens matrix 31. In this manner, the solid-state imaging device 11-1' shown in FIG. 7 can be manufactured.

In the solid-state imaging device 11-1' having such a configuration, the AF pixels 12Z' can receive a larger amount of light than the AF pixels 12Z in which color filters 25 are provided. Thus, the solid-state imaging device 11-1' can achieve more preferable AF control characteristics.

It should be noted that the color filters 25 of the solid-state imaging device 11 are not limited to the above described red, blue, and green color filters. Specifically, at least two colors among red, blue, green, cyan, magenta, yellow, transparence, and gray can be selected and used for the color filters 25 of the solid-state imaging device 11, for example.

Figure 8:
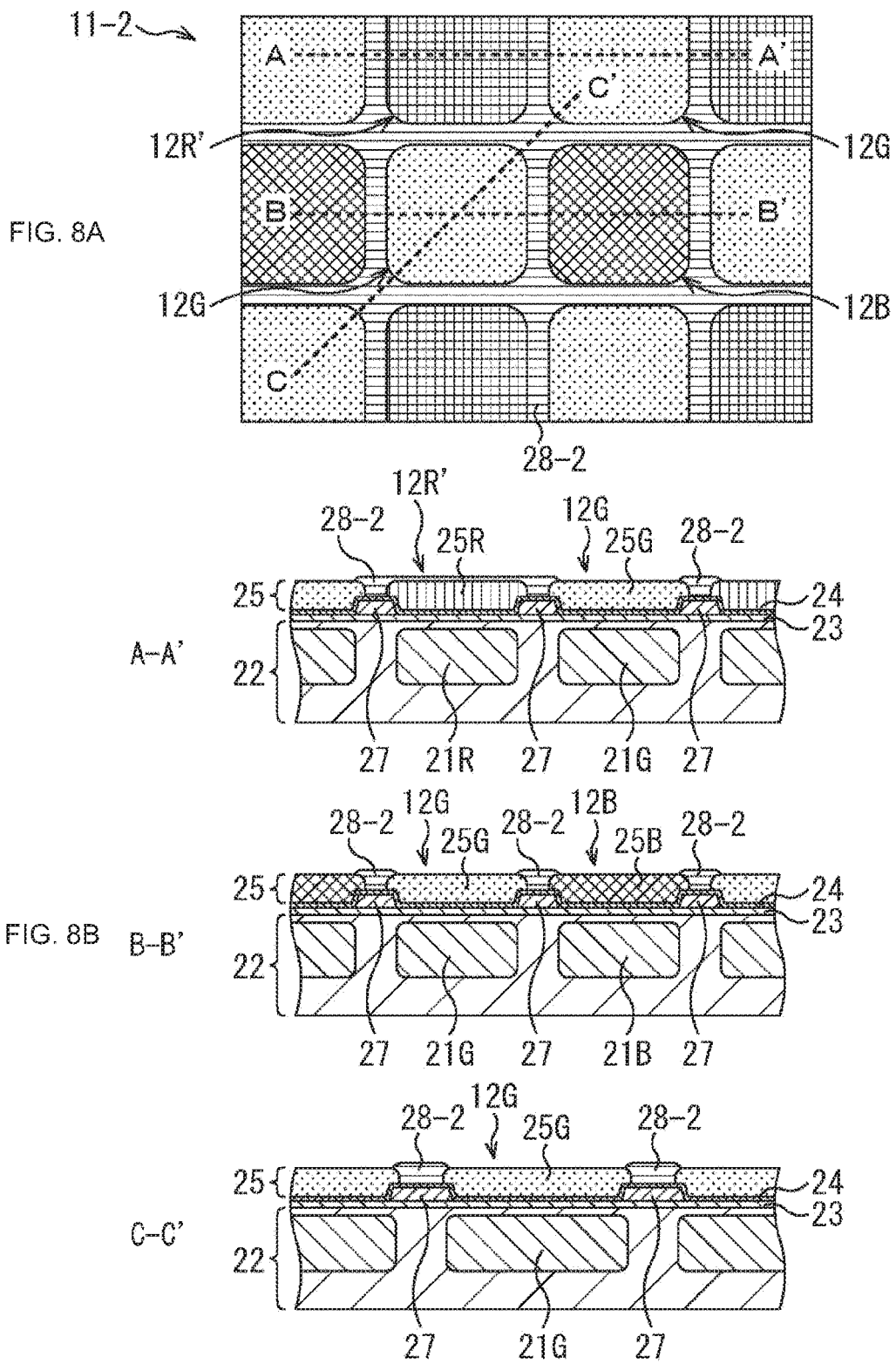
FIGS. 8A and 8B are diagrams showing an example configuration of a third embodiment of a solid-state imaging device.

FIGS. 8A and 8B are diagrams showing an example configuration of a third embodiment of a solid-state imaging device. Like FIG. 2A, FIG. 8A shows a plan view of the configuration of a solid-state imaging device 11-2. Like FIG. 2B, FIG. 8B shows cross-sections taken along the lines A-A', B-B', and C-C' defined in FIG. 8A.

The solid-state imaging device 11-2 shown in FIGS. 8A and 8B differs from the solid-state imaging device 11 shown in FIGS. 1 and 2A and 2B in that a second light shielding film 28-2 is formed to cover the red color filters 25R of red pixels 12R'. It should be noted that, in the other aspects, the solid-state imaging device 11-2 has a similar configuration to the solid-state imaging device 11 shown in FIGS. 1 and 2A and 2B.

Specifically, in the solid-state imaging device 11-2, the first light shielding film 27 is formed only between the pixels 12, and the second light shielding film 28-2 is formed between the pixels 12 and is designed to thinly cover the red color filters 25R. It should be noted that the thickness of the second light shielding film 28 on the red color filters 25R is smaller than that between the pixels 12, to allow light to pass therethrough. As described above, the second light shielding film 28 is formed with a photosensitive resin having a carbon black pigment or a titanium black pigment internally added thereto. Where the second light shielding film 28 has a smaller thickness than a predetermined thickness, light can pass therethrough.

In the solid-state imaging device 11-2 having such a configuration, the second light shielding film 28 functions as a reflection reducing film that reduces light reflection from the surfaces of the red color filters 25R in the red pixels 12R'. Accordingly, image quality degradation due to light reflected from the surfaces of the red color filters 25R (this degradation is so-called red-ball ghosts) can be reduced in the solid-state imaging device 11-2. Specifically, light reflected by the surfaces of red color filters is reflected by an infrared cut filter or the like, and reenters the other pixels, resulting in image quality degradation in conventional cases. However, the solid-state imaging device 11-2 can reduce such image quality degradation.

Figure 9:
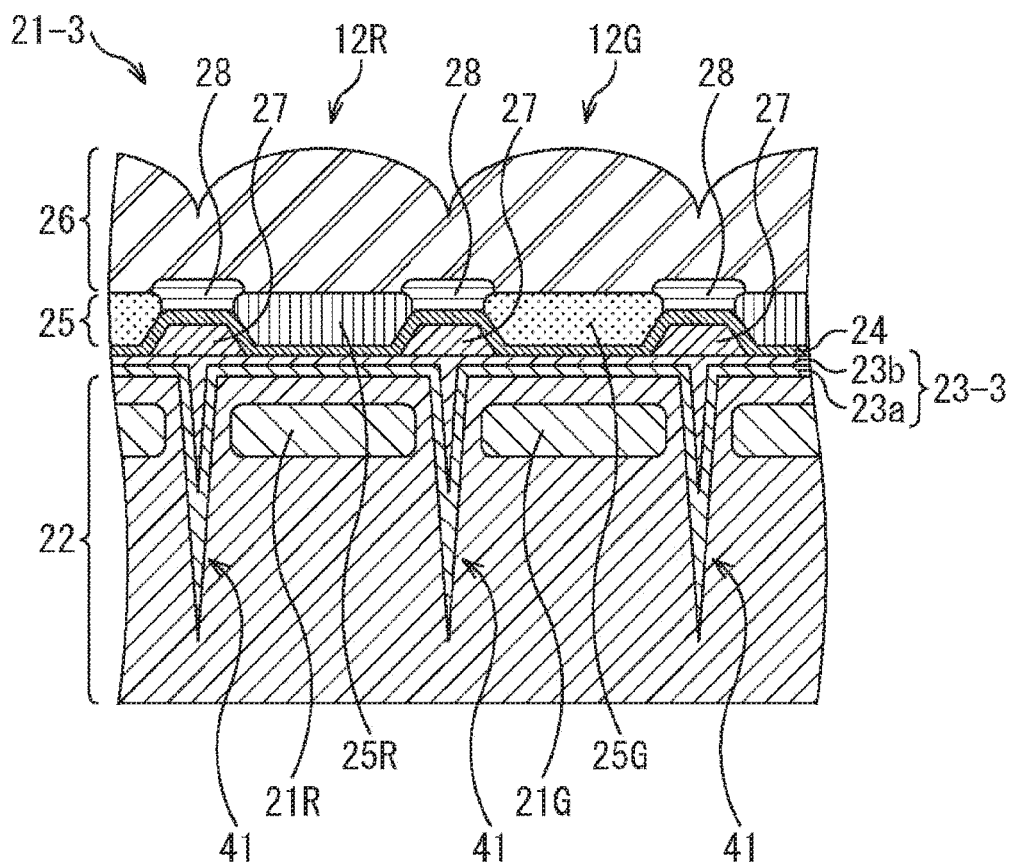
FIG. 9 is a diagram showing an example configuration of a fourth embodiment of a solid-state imaging device.

FIG. 9 is a diagram showing an example configuration of a fourth embodiment of a solid-state imaging device. Like FIG. 1, FIG. 9 shows a cross-section of the configuration of a solid-state imaging device 11-3.

In the solid-state imaging device 11-3 shown in FIG. 9, grooves (trenches) are formed in a semiconductor substrate 22 so as to separate the photodiodes 21 of adjacent pixels 12 from one another, and the grooves are filled with an insulating film 23-3, to form pixel separating portions 41. Like the insulating film 23-3, each pixel separating portion 41 is a stack structure formed by stacking a hafnium oxide film 23b on a silicon oxide film 23a, for example. In this manner, the pixels 12 are separated from one another by the pixel separating portions 41 in the semiconductor substrate 22. Thus, color mixing due to charges generated by photoelectric conversion at the photodiodes 21 can be prevented.

In the solid-state imaging device 11-3 having such a configuration, color mixing due to incident light is prevented by the first light shielding film 27 and the second light shielding film 28, and color mixing due to charges is prevented by the pixel separating portions 41. Thus, color mixing is further reduced, and high-quality images can be taken.

Figure 10:
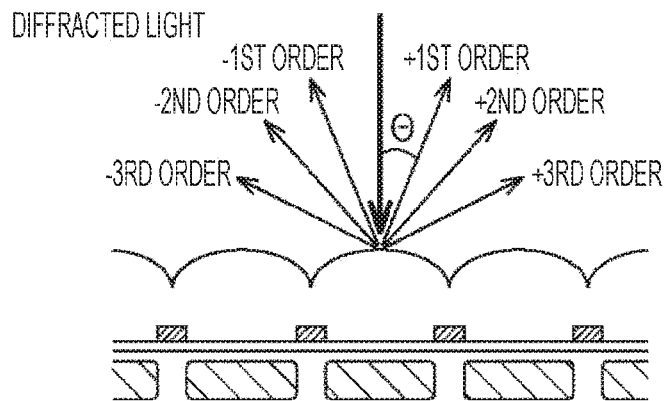
FIG. 10 is a diagram for explaining pixel sizes.

Referring now to FIG. 10, pixel sizes in the solid-state imaging device 11 are described.

For example, diffracted light generated by diffracting incident light entering a microlens 26 of the solid-state imaging device 11 is expressed as $d \cdot \sin \theta = m \cdot \lambda$, as shown in the upper half of FIG. 10, where d represents the array pitch of the microlenses 26, $\theta$ represents the diffraction angle of diffracted light with respect to incident light, and $\lambda$ represents the wavelength of the incident light. In the solid-state imaging device 11 that processes visible light (400 to 700 nm), the diffracted light order at 400 nm on the short-wavelength side on which the diffracted light order is likely to increase is determined not to increase at the order ratio generated at the size of 1.75 μm squares, according to the above equation.

For example, as shown in the lower half of FIG. 10, the order of diffracted light to be generated does not change between the pixel size of 1.75 μm squares and the pixel size of 1.979 μm squares, but the order of diffracted light to be generated increases at the pixel size of 1.980 μm or larger. In this way, if large microlenses are formed in accordance with an increase in pixel size, the order of diffracted reflected light on the surface also becomes larger. As a result, light that causes noise, such as flare, ghosts, and color mixing components, increases, and image quality degradation becomes conspicuous.

Accordingly, in a case where the solid-state imaging device 11 is applied to a solid-state imaging device of a large size, such as the Advanced Photo System typeC (APS-C) size or 35 mm size, the effect to reduce image quality degradation can be effectively achieved, and therefore, such an application is more preferable. That is, in a large-sized solid-state imaging device, the pixel size is also large, and a large amount of diffracted light is generated at a pixel size of 1.980 μm or larger as shown in FIG. 10. As a result, image quality is degraded. In a case where the solid-state imaging device 11 is applied to a large-sized solid-state imaging device, on the other hand, even if a large amount of diffracted light is generated, adverse influence of the diffracted light can be reduced by the first light shielding film 27 and the second light shielding film 28.

Particularly, to take images with higher sensitivity and higher precision with large-sized solid-state imaging devices, applications to back-illuminated solid-state imaging devices have been considered in recent years. Therefore, the structure of the solid-state imaging device 11 is applied to a large-sized back-illuminated solid-state imaging device, so that unnecessary light can be prevented from entering the photodiodes 21, and image quality degradation can be avoided. With this, it is possible to take high-quality images that can compensate for the increase in the production cost in applying a back-illuminated solid-state imaging device to a large-sized solid-state imaging device.

It should be noted that the solid-state imaging device 11 can be combined with the above described embodiments and modification. For example, all the configurations of the solid-state imaging device 11 shown in FIG. 1, the solid-state imaging device 11-1 shown in FIGS. 5A and 5B, and the solid-state imaging device 11-2 shown in FIGS. 8A and 8B can be combined. Specifically, a solid-state imaging device may be formed to shield the pixels 12 from light from one another with the first light shielding film 27 and the second light shielding film 28, include the AF pixels 12Z', and thinly cover the red pixels 12R' with the second light shielding film 28. With this configuration, flare-ghost characteristics can be improved, more preferable AF characteristics can be achieved, and images with a higher quality can be taken.

It should be noted that the solid-state imaging device 11 of each of the above described embodiments can be used in various kinds of electronic apparatuses, such as imaging systems for digital still cameras and digital video cameras, portable telephone devices having imaging functions, and other apparatuses having imaging functions.

Figure 11:
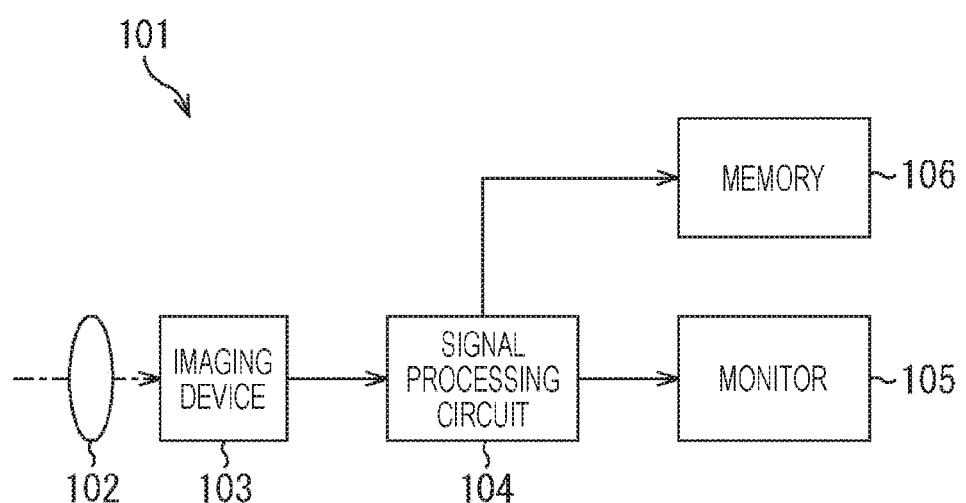
FIG. 11 is a block diagram showing an example configuration of an imaging apparatus installed in an electronic apparatus.

FIG. 11 is a block diagram showing an example configuration of an imaging apparatus installed in an electronic apparatus.

As shown in FIG. 11, an imaging apparatus 101 includes an optical system 102, an imaging device 103, a signal processing circuit 104, a monitor 105, and a memory 106, and can take still images and moving images.

The optical system 102 includes one or more lenses to guide light (incident light) from an object to the imaging device 103, and form an image on the light receiving surface (the sensor portion) of the imaging device 103.

A solid-state imaging device 11 of any of the above described embodiments is used as the imaging device 103. In the imaging device 103, electrons are accumulated for a certain period of time in accordance with an image to be formed on the light receiving surface via the optical system 102. Then, a signal in accordance with the electrons accumulated in the imaging device 103 is then supplied to the signal processing circuit 104.

The signal processing circuit 104 performs various kinds of signal processing on pixel signals that are output from the imaging device 103. The image (image data) obtained through the signal processing performed by the signal processing circuit 104 is supplied to and displayed on the monitor 105, or is supplied to and stored (recorded) into the memory 106.

In the imaging apparatus 101 having the above described configuration, a solid-state imaging device 11 of any of the above embodiments is used, so that images with a higher quality can be taken, for example.

Figure 12:
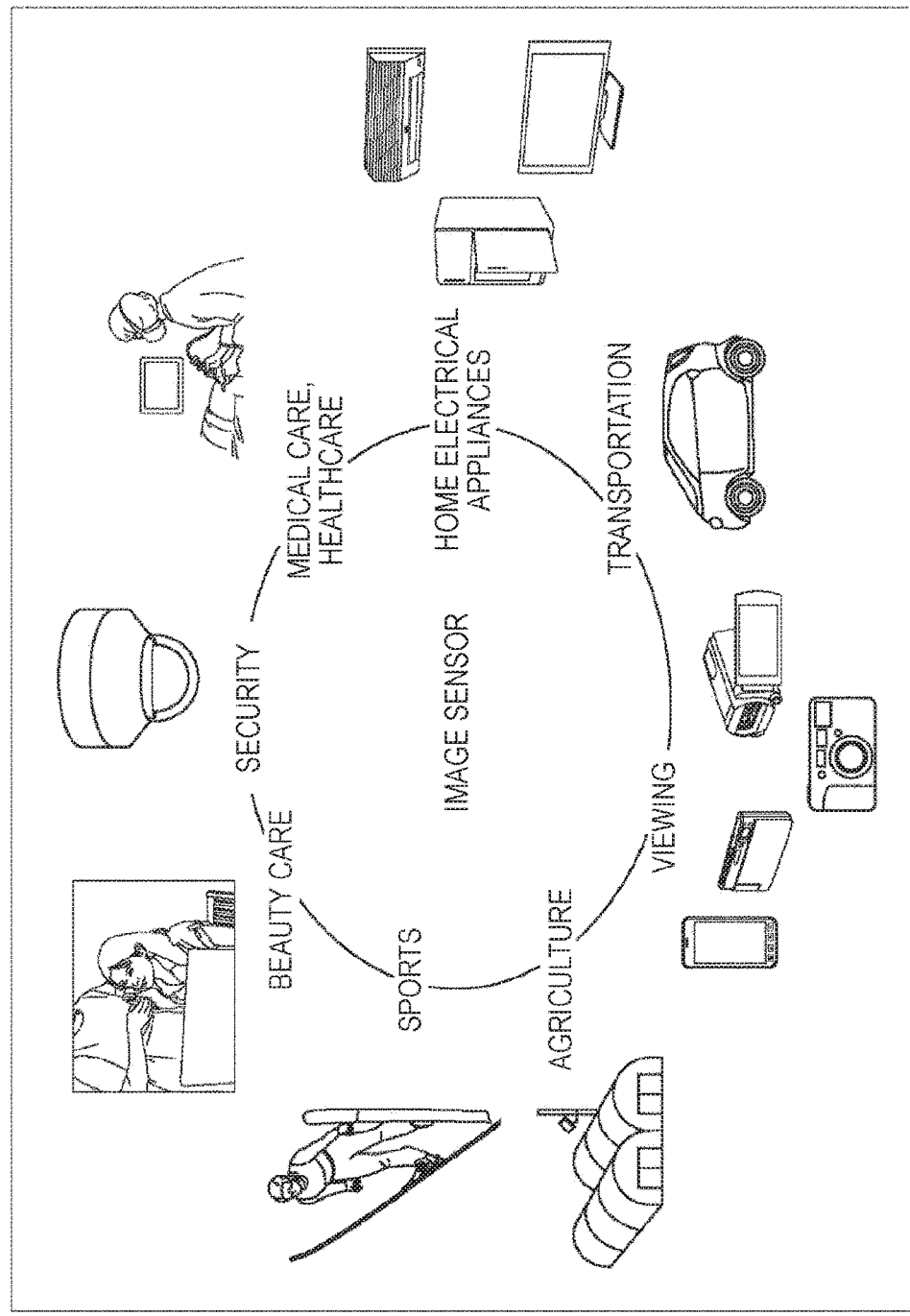
FIG. 12 is a diagram showing examples of use of a solid-state imaging device.

FIG. 12 is a diagram showing examples of use of the above-described solid-state imaging device 11.

The above described solid-state imaging devices (image sensors) 11 can be used in various cases where light such as visible light, infrared light, ultraviolet light, and an X-ray is to be sensed as follows.

Devices configured to take images for appreciation activities, such as digital cameras and portable devices with camera functions.

Devices for transportation use, such as vehicle-mounted sensors configured to take images of the front, the back, the surroundings, and the inside of an automobile to perform safe driving like an automatic stop and recognize a driver's condition, surveillance cameras for monitoring running vehicles and roads, and ranging sensors for measuring distances between vehicles.

Devices for home electronics use, such as television sets, refrigerators, and air conditioners for imaging a gesture of a user and operating a device according to the gesture.

Devices for medical care use and health care use, such as endoscopes and devices for receiving infrared light for angiography.

Devices for security use, such as surveillance cameras for crime prevention and cameras for personal authentication.

Devices for beauty care use, such as skin measurement devices configured to image a skin and microscopes for imaging a scalp.

Devices for sport use, such as action cameras and wearable cameras for sports.

Devices for agricultural use such as cameras for monitoring conditions of fields and crops.

It should be noted that the present technology may also be embodied in the configurations described below.

(1)
A solid-state imaging device including:
a semiconductor substrate having photodiodes formed for respective pixels, the photodiodes performing photoelectric conversion;
color filters configured to pass light in the colors corresponding to the respective pixels, the color filters being stacked on the light incident surface side of the semiconductor substrate; and
a light shielding film provided between the color filters of the respective pixels, the light shielding film being formed by stacking a first light shielding film and a second light shielding film, the first light shielding film and the second light shielding film being formed with two different materials from each other.

(2)
The solid-state imaging device of (1), wherein
the first light shielding film is stacked on a side closer to the semiconductor substrate than the second light shielding film is,
the first light shielding film is formed with a metal having a light shielding effect, and
the second light shielding film is formed with a resin having photosensitivity.

(3)
The solid-state imaging device of (1) or (2), wherein some of the pixels are autofocus pixels to be used for controlling autofocusing in accordance with a phase difference in the imaging surface of the solid-state imaging device, and
the first light shielding film and the second light shielding film are formed on the autofocus pixels, to shield the autofocus pixels from light to perform pupil splitting.

(4)
The solid-state imaging device of (3), wherein, in the autofocus pixels, the portions equivalent to the color filters in the other pixels are filled with a transparent material.

(5)
The solid-state imaging device of any of (1) to (4), wherein the second light shielding film has a thickness not greater than a predetermined thickness on red pixels among the pixels, to cover the color filters of the red pixels, the red pixels receiving light in red.

(6)
The solid-state imaging device of any of (1) to (5), wherein at least two colors among red, blue, green cyan, magenta, yellow, transparence, and gray are selected and used for the color filters provided for the respective pixels.

(7)
The solid-state imaging device of any of (1) to (6), wherein a pixel separating portion is formed in the semiconductor substrate, the pixel separating portion having insulation properties to separate the photodiodes of adjacent ones of the pixels from one another.

(8)
A method of manufacturing a solid-state imaging device, including the steps of:
forming photodiodes in a semiconductor substrate for respective pixels, the photodiodes performing photoelectric conversion;
stacking color filters on the light incident surface side of the semiconductor substrate, the color filters passing light in the colors corresponding to the respective pixels; and
providing a light shielding film between the color filters of the respective pixels, the light shielding film being formed by stacking a first light shielding film and a second light shielding film, the first light shielding film and the second light shielding film being formed with two different materials from each other.

(9)
An electronic apparatus including
a solid-state imaging device including:
a semiconductor substrate having photodiodes formed for respective pixels, the photodiodes performing photoelectric conversion;
color filters configured to pass light in the colors corresponding to the respective pixels, the color filters being stacked on the light incident surface side of the semiconductor substrate; and
a light shielding film provided between the color filters of the respective pixels, the light shielding film being formed by stacking a first light shielding film and a second light shielding film, the first light shielding film and the second light shielding film being formed with two different materials from each other.

It should be noted that this embodiment is not limited to the above described embodiments, and various modifications may be made to them without departing from the scope of the present disclosure.

REFERENCE SIGNS LIST

11 Solid-state imaging device
12 Pixel
21 Photodiode
22 Semiconductor substrate
23 Insulating film
24 Non-planarized adhesive film
25 Color filter
26 Microlens
27 First light shielding film
28 Second light shielding film
29 Multiple wiring layer
30 Light shielding film
31 Microlens matrix
32 Photosensitive resin
41 Pixel separating portion

The invention claimed is:

1. A solid-state imaging device, comprising:
a semiconductor substrate comprising photodiodes for respective pixels of a plurality of pixels, wherein the photodiodes are configured to photoelectrically convert incident light into electrical charges;
a plurality of color filters that comprises at least one red color filter, wherein the plurality of color filters is configured to pass the incident light in colors corresponding to the respective pixels,
the plurality of color filters is on a light incident surface side of the semiconductor substrate; and
a light shielding film comprising a first light shielding film and a second light shielding film, wherein
the first light shielding film and the second light shielding film are of two different materials,
the first light shielding film and the second light shielding film are between color filters of the plurality of color filters of the respective pixels,
the second light shielding film comprises a first portion between the plurality of color filters and a second portion on an entire top surface of the at least one red color filter,
the entire top surface of the at least one red color filter is at the light incident surface side of the semiconductor substrate,
a combination of a first thickness of the first light shielding film and a second thickness of the first portion of the second light shielding film above the semiconductor substrate is substantially same as a third thickness of each of the plurality of color filters above the semiconductor substrate,
a fourth thickness of the second portion of the second light shielding film is smaller than the second thickness of the first portion of the second light shielding film,
the first light shielding film is closer to the semiconductor substrate than the second light shielding film,
the first light shielding film comprises a metal comprising a light shielding effect, and the second light shielding film comprises a resin comprising photosensitivity.

2. The solid-state imaging device according to claim 1, wherein
at least one pixel of the plurality of pixels is autofocus pixel,
the at least one pixel is configured to control autofocus based on a phase difference in an imaging surface of the solid-state imaging device,
the first light shielding film and the second light shielding film are on the autofocus pixel, and
the first light shielding film and the second light shielding film are configured to shield the at least one pixel from light for execution of pupil splitting process.

3. The solid-state imaging device according to claim 2, wherein
a first portion of the at least one pixel is filled with a transparent material, and
the first portion of the at least one pixel is equivalent to a second portion of the plurality of color filters in the plurality of pixels other than the autofocus pixel.

4. The solid-state imaging device according to claim 1, wherein the plurality of color filters for the respective pixels further comprises at least one color among blue, green, cyan, magenta, yellow, transparence, or gray.

5. The solid-state imaging device according to claim 1, wherein
the semiconductor substrate comprises a pixel separating portion comprising insulation properties, and
the pixel separating portion is configured to separate the photodiodes of adjacent pixels of the plurality of pixels from one another.

6. The solid-state imaging device according to claim 1, wherein the first light shielding film and the first portion of the second light shielding film are stacked between the plurality of color filters of the respective pixels.

7. A method of manufacturing a solid-state imaging device, comprising:
forming photodiodes for respective pixels of a plurality of pixels in a semiconductor substrate, wherein the photodiodes are configured to photoelectrically convert incident light into electrical charges;
stacking a plurality of color filters on a light incident surface side of the semiconductor substrate, wherein
the plurality of the color filters comprises at least one red color filter, and
the plurality of color filters is configured to pass the incident light in colors corresponding to the respective pixels; and
providing a first light shielding film and a second light shielding film between the plurality of color filters of the respective pixels, wherein
the first light shielding film and the second light shielding film are of two different materials,
the second light shielding film comprises a first portion between the plurality of color filters and a second portion on an entire top surface of the at least one red color filter,
the entire top surface of the at least one red color filter is at the light incident surface side of the semiconductor substrate,
a combination of a first thickness of the first light shielding film and a second thickness of the first portion of the second light shielding film above the semiconductor substrate is substantially same as a third thickness of each of the plurality of color filters above the semiconductor substrate,
a fourth thickness of the second portion of the second light shielding film is smaller than the second thickness of the first portion of the second light shielding film,
the first light shielding film is closer to the semiconductor substrate than the second light shielding film,
the first light shielding film comprises a metal comprising a light shielding effect, and
the second light shielding film comprises a resin comprising photosensitivity.

8. An electronic apparatus, comprising:
a solid-state imaging device, wherein the solid-state imaging device comprises:
a semiconductor substrate comprising photodiodes for respective pixels of a plurality of pixels wherein the photodiodes are configured to photoelectrically convert incident light into electrical charges;
a plurality of color filters that comprises at least one red color filter, wherein
the plurality of color filters is configured to pass the incident light in colors corresponding to the respective pixels, and
the plurality of color filters is on a light incident surface side of the semiconductor substrate; and
a light shielding film comprising a first light shielding film and a second light shielding film, wherein
the first light shielding film and the second light shielding film are of two different materials,
the first light shielding film and the second light shielding film are between color filters of the plurality of color filters of the respective pixels,
the second light shielding film comprises a first portion between the plurality of color filters and a second portion on an entire top surface of the at least one red color filter, the entire top surface of the at least one red color filter is at the light incident surface side of the semiconductor substrate, a combination of a first thickness of the first light shielding film and a second thickness of the first portion of the second light shielding film above the semiconductor substrate is substantially same as a third thickness of each of the plurality of color filters above the semiconductor substrate, a fourth thickness of the second portion of the second light shielding film is smaller than the second thickness of the first portion of the second light shielding film, and the first light shielding film is closer to the semiconductor substrate than the second light shielding film, the first light shielding film comprises a metal comprising a light shielding effect, and the second light shielding film comprises a resin comprising photosensitivity.

* * * * *